(12) United States Patent
Chen et al.

(10) Patent No.: US 6,187,630 B1
(45) Date of Patent: Feb. 13, 2001

(54) METHOD FOR FORMING HEMISPHERICAL SILICON GRAINS ON DESIGNATED AREAS OF SILICON LAYER

(75) Inventors: Anchor Chen, Pingtung; Shih-Ching Chen, Nantou Hsien, both of (TW)

(73) Assignee: United Semiconductor Corp., Hsinchu (TW)

( * ) Notice: Under 35 U.S.C. 154(b), the term of this patent shall be extended for 0 days.

(21) Appl. No.: 09/241,526

(22) Filed: Feb. 1, 1999

(30) Foreign Application Priority Data

Dec. 4, 1998 (TW) .................................. 87120145

(51) Int. Cl.$^7$ ....................... H01L 21/8242; H01L 21/20; H01L 21/44
(52) U.S. Cl. ..................... 438/255; 438/398; 438/665; 438/491; 438/532
(58) Field of Search ................................. 438/491, 532, 438/251, 766, 255, 398, 665

(56) References Cited

U.S. PATENT DOCUMENTS 4,697,333 * 10/1987 Nakahara .
5,597,741 * 1/1997 Sakamoto et al. .
5,773,342 * 6/1998 Fukase .
5,821,157 * 10/1998 Lee et al. .
5,897,352 * 4/1999 Lin et al. .
5,915,189 * 6/1999 Sim .

* cited by examiner

*Primary Examiner*—Charles Bowers
*Assistant Examiner*—Stephen W. Smoot
(74) *Attorney, Agent, or Firm*—Jiawei Huang; J C Patents

(57) ABSTRACT

A method for forming hemispherical silicon grains on selected surfaces of a silicon layer includes the steps of forming a doped polysilicon layer over a substrate, and then forming amorphous spacers on the sidewalls of the doped polysilicon layer. Thereafter, an ion implantation is carried out to transform the upper portion of the doped polysilicon into an amorphous silicon layer. Finally, hemispherical silicon grains are formed on the upper surface of the amorphous layer lying above the polysilicon layer and the exposed surface of the amorphous spacers.

13 Claims, 4 Drawing Sheets

METHOD FOR FORMING HEMISPHERICAL SILICON GRAINS ON DESIGNATED AREAS OF SILICON LAYER

BACKGROUND OF THE INVENTION

1. Field of Invention

The present invention relates to a method for forming integrated circuit device. More particularly, the present invention relates to a method for forming hemispherical silicon grains on designated areas of a silicon layer.

2. Description of Related Art

As structural dimensions of a semiconductor device continue to shrink, each device occupies a much smaller substrate area. However, the surface area of some devices, for example, the capacitor of a dynamic random access memory (DRAM), must have at least a minimum surface area for capacitative coupling.

Otherwise, interference from nearby circuits or devices can affect its operation and the number of refreshes can increase as well. One method of increasing the surface area of a capacitor is to form hemispherical silicon grains on the lower electrode surface of the capacitor. Hence, the overall surface area of the capacitor per unit area of silicon chip surface can be increased so that the amount of electric charges stored in a capacitor is raised.

FIGS. 1A and 1B are schematic, cross-sectional views showing the steps according to a conventional method of forming hemispherical silicon grains on the lower electrode surfaces of a capacitor. The storage capacity of the capacitor is thereby increased.

First, as shown in FIG. 1A, a substrate 100 having a field effect transistor 104 thereon is provided. Then, a dielectric layer 110 is formed over the substrate 100 and the field effect transistor 104. Thereafter, a contact opening 112 that exposes a source/drain region 108 is formed in the dielectric layer 110. In the subsequent step, a doped amorphous silicon layer 113 having a thickness of about 6000 Å is deposited, completely fills the contact opening 112, and covers the dielectric layer, as well.

Next, the doped amorphous silicon layer 113 is patterned to form a doped amorphous silicon layer 113a as shown in FIG. 1B, thereby forming the bulk of the lower electrode of a capacitor. After that, hemispherical silicon grains are formed on the exposed surface of the doped amorphous silicon layer 113a in order to increase the overall surface area of the lower electrode.

In the aforementioned method, a very thick layer of doped amorphous silicon layer 113 has to be deposited so that a proper electrode structure for the capacitor is formed. However, the rate of deposition of amorphous silicon is rather low, and hence a lot of time is spent in the process of depositing doped amorphous silicon material onto the dielectric layer 110 to a sufficient thickness. The longer the process of depositing amorphous silicon, the slower the production rate of the semiconductor device is.

Furthermore, a long deposition tends to increase the chance of microcrystallization inside the amorphous silicon layer 113. Microcrystallization occurs around nucleation sites, and the nucleation sites are the locations where dopants congregate. The microcrystals inside the amorphous silicon layer tend to limit the growth of hemispherical silicon grains on the lower electrode. Therefore, the ultimate density of the hemispherical silicon grains may decrease considerably.

In other words, the longer the depositing time for the doped amorphous silicon layer 113, the higher the probability of microcrystallization is. The higher the microcrystal density inside the amorphous silicon layer, the lower the quantity of hemispherical silicon grains on the lower electrode surfaces is. Hence, the supposed amount of increase in effective capacitative area is not actually attained.

One method of preventing the formation of too many microcrystals inside a doped amorphous silicon layer 113 is to lower the concentration of dopants during deposition. However, the doped amorphous silicon layer 113 also fills the contact opening 112 so that the source/drain region 108 is electrically connected. Therefore, too few dopants inside the doped amorphous silicon layer 113 results in a high contact resistance between the doped amorphous silicon layer 113 and the source/drain region 108.

In light of the foregoing, there is a need to improve the method of forming a doped amorphous silicon layer so that more hemispherical silicon grains can be formed over the lower electrode surfaces of a capacitor.

SUMMARY OF THE INVENTION

Accordingly, the purpose of the present invention is to provide a method for forming hemispherical silicon grains on the surfaces of a doped amorphous silicon layer such that the density of silicon grains on its surfaces is not affected by microcrystallization at nuclear sites within the doped amorphous silicon layer.

In another aspect, the purpose of this invention is to provide a method for forming hemispherical silicon grains on the lower electrode surfaces of a capacitor such that contact resistance between the lower electrode and a source/drain region is lowered.

To achieve these and other advantages and in accordance with the purpose of the invention, as embodied and broadly described herein, the invention provides a method for forming hemispherical silicon grains on selected surfaces of a silicon layer. The method includes the steps of forming a doped polysilicon layer over a substrate, and then forming amorphous spacers on the sidewalls of the doped polysilicon layer. Thereafter, an ion implantation is carried out to transform the upper portion of the doped polysilicon into an amorphous silicon layer. Finally, hemispherical silicon grains are formed on the upper surface of the amorphous layer lying above the polysilicon layer and the exposed surface of the amorphous spacers.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
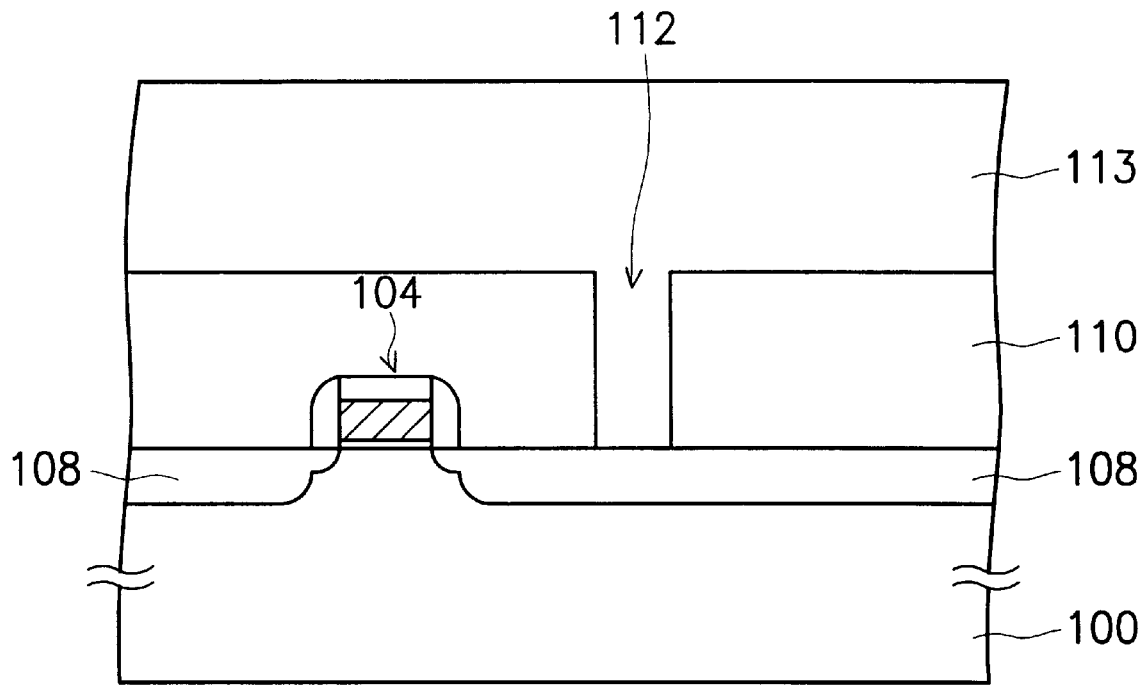
FIGS. 1A and 1B are schematic cross-sectional views showing the steps according to a conventional method of forming hemispherical silicon grains over the lower electrode surfaces of a capacitor.
Figure 1B:
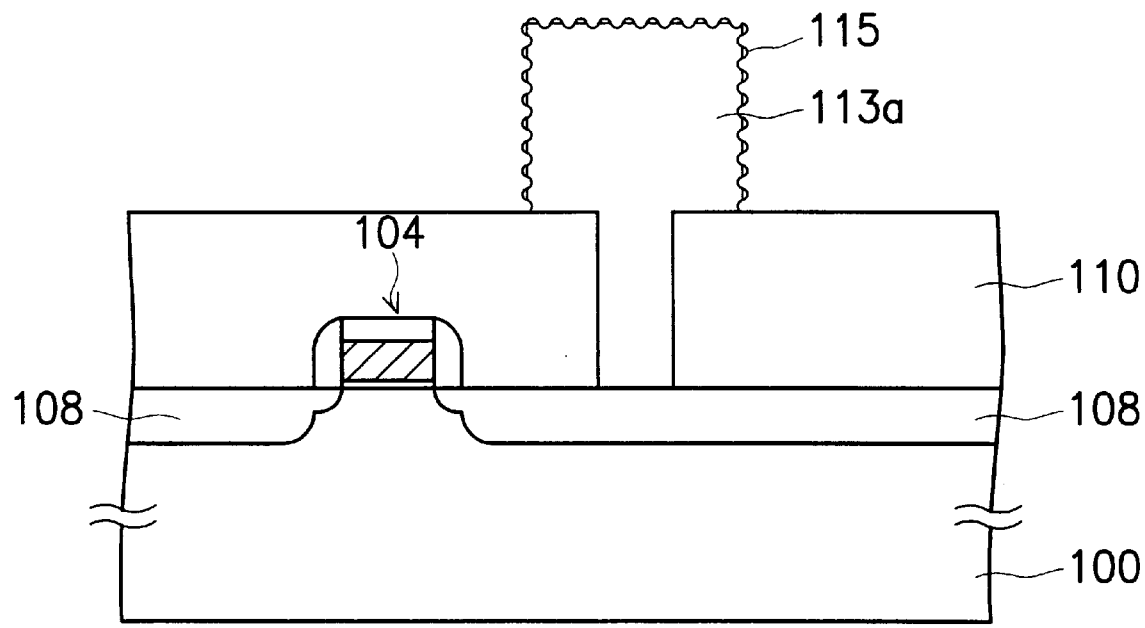

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic, cross-sectional views showing the progression of manufacturing steps for forming the lower electrode of a capacitor according to one preferred embodiment of this invention.

Figure 2A:
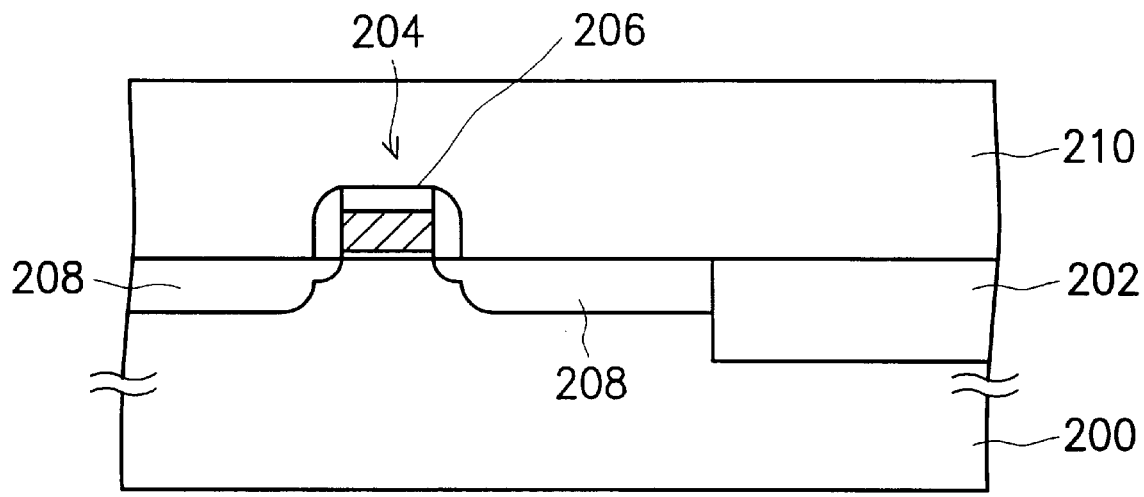
FIGS. 2A through 2E are schematic, cross-sectional views showing the progression of manufacturing steps for forming the lower electrode of a capacitor according to one preferred embodiment of this invention.

As shown in FIG. 2A, an isolation region 202 is formed in a substrate 200 so that an active region for accommodating a semiconductor device is defined. Thereafter, a field effect transistor 204 is formed in the active region. The field effect transistor 204 includes a gate structure 206 and source/drain regions 208. Next, a dielectric layer 210 is formed over the substrate 200. The dielectric layer can be a silicon oxide or a borophosphosilicate glass (BPSG) layer formed by performing a chemical vapor deposition (CVD) operation. Preferably, a chemical-mechanical polishing operation is carried out to planarize the dielectric layer 210 after it is formed.

Figure 2B:
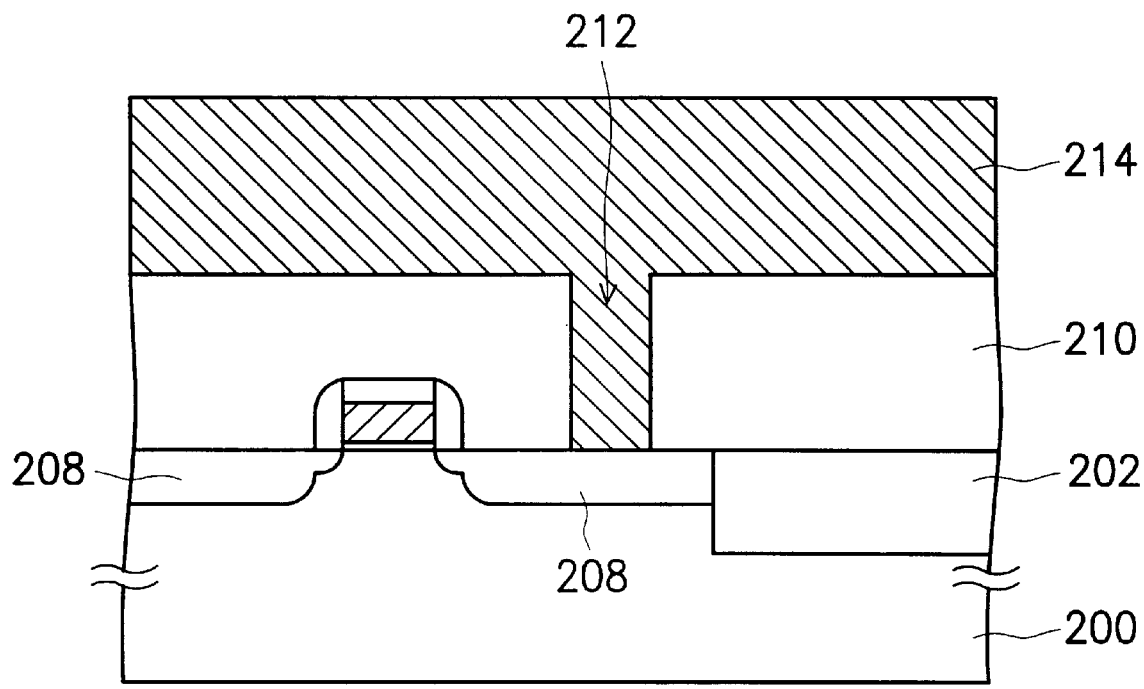
Figure 2C:
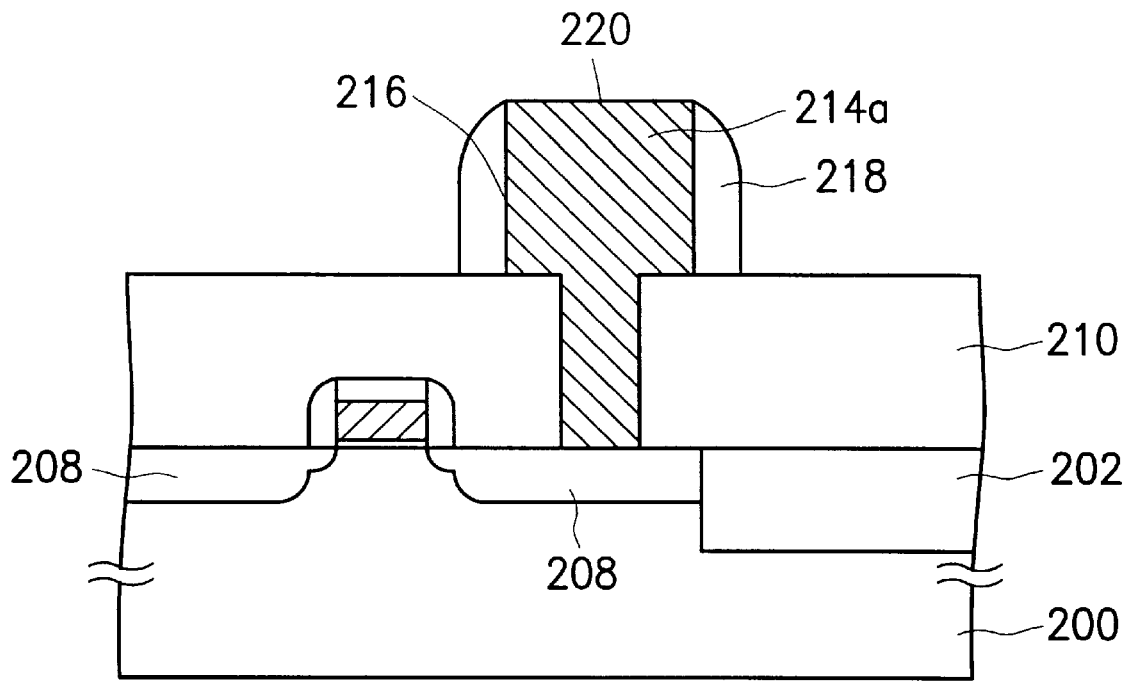

As shown in FIG. 2B, conventional photolithographic and etching operations are conducted to pattern the dielectric layer 210 so that a contact opening 212 is formed in the dielectric layer 210. The contact opening 212 exposes one of the source/drain regions 208 in the substrate 200. Subsequently, a doped polysilicon layer 214 is formed over the substrate 200 so that the contact opening 212 is filled and the dielectric layer 210 is covered. The method of forming the doped polysilicon layer 214 includes performing a chemical vapor deposition (CVD) operation. The dopants within the polysilicon layer 214 can be added during the chemical vapor deposition (CVD) operation. Alternatively, the dopants can be added using an ion implantation after the polysilicon layer is formed. The concentration of dopants inside the polysilicon layer 214 is preferably between $5 \times 10^{20}$ l/cm$^3$ and $5 \times 10^{21}$ l/cm$^3$. Conventional photolithographic and etching operations are again used to pattern the doped polysilicon layer 214 into a doped polysilicon layer 214a as shown in FIG. 2C.

Preferably, the doped polysilicon layer 214a is cylindrical. Thereafter, amorphous silicon spacers 218 are formed on the sidewalls 216 of the doped polysilicon layer 214a. The amorphous silicon spacers 218 and the doped polysilicon layer 214a together form the lower electrode body of a capacitor. The amorphous silicon spacers 218 can be formed by depositing a layer of amorphous silicon having a thickness of between 500 Å and 2500 Å over the dielectric layer 210, using a chemical vapor deposition (CVD) method. Then, the amorphous silicon layer is etched back to expose a portion of the dielectric layer 210 and the upper surface 220 of the doped polysilicon layer 214a.

Figure 2D:
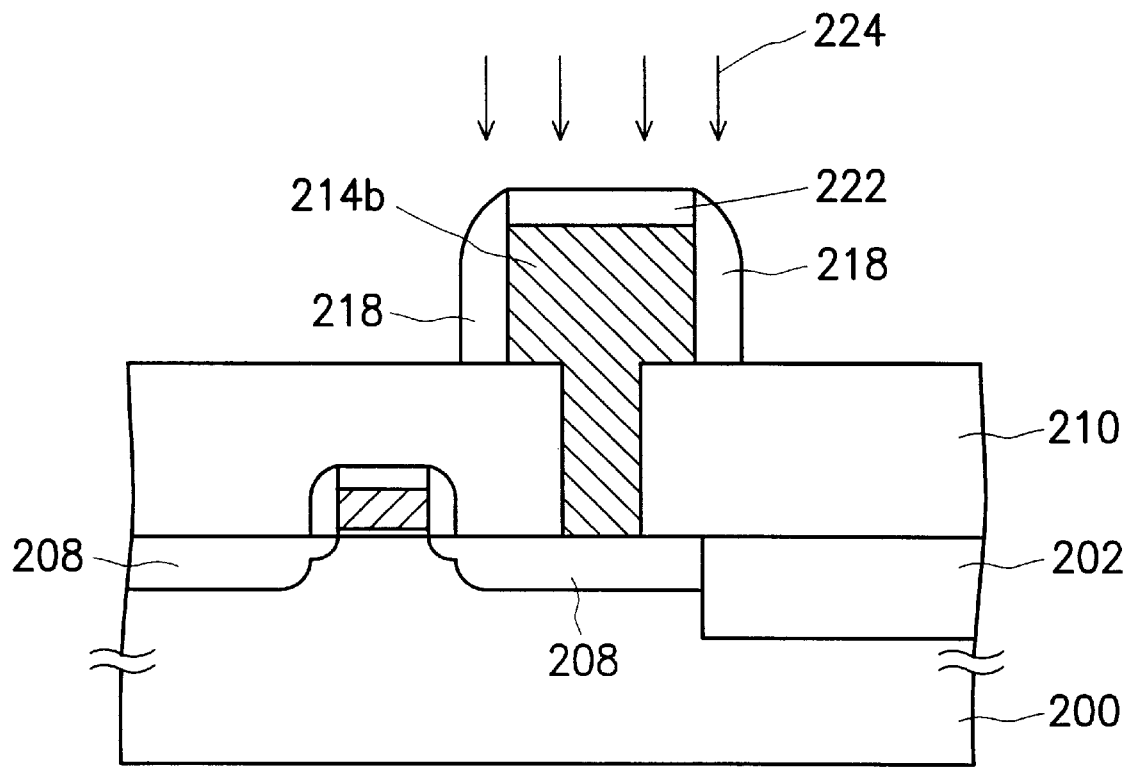

As shown in FIG. 2D, the exposed upper surface 220 of the doped polysilicon layer 214a is transformed into an amorphous layer 222 and a doped polysilicon layer 214b under the amorphous layer 222. The preferred method of forming the amorphous layer 222 includes performing an ion implantation 224 that bombards dopants directly into the doped polysilicon layer 214a. Dopants that preferably have a heavy atomic weight, such as arsenic (As), argon (Ar) or antimony (Sb), are implanted into the doped polysilicon layer 214a. The dopant of heavy atomic weight generally refers to the ions having a large number of nucleons, so that it is easy to transform polysilicon into amorphous silicon, as well known in the art. The energy used in the implantation 224 must be large enough to transform a layer of the doped polysilicon layer 214a having a thickness of between 500 Å and 1500 Å from the upper surface 220 into amorphous silicon. In other words, the amorphous silicon layer 222 preferably has a thickness of between 500 Å and 1500 Å.

Figure 2E:
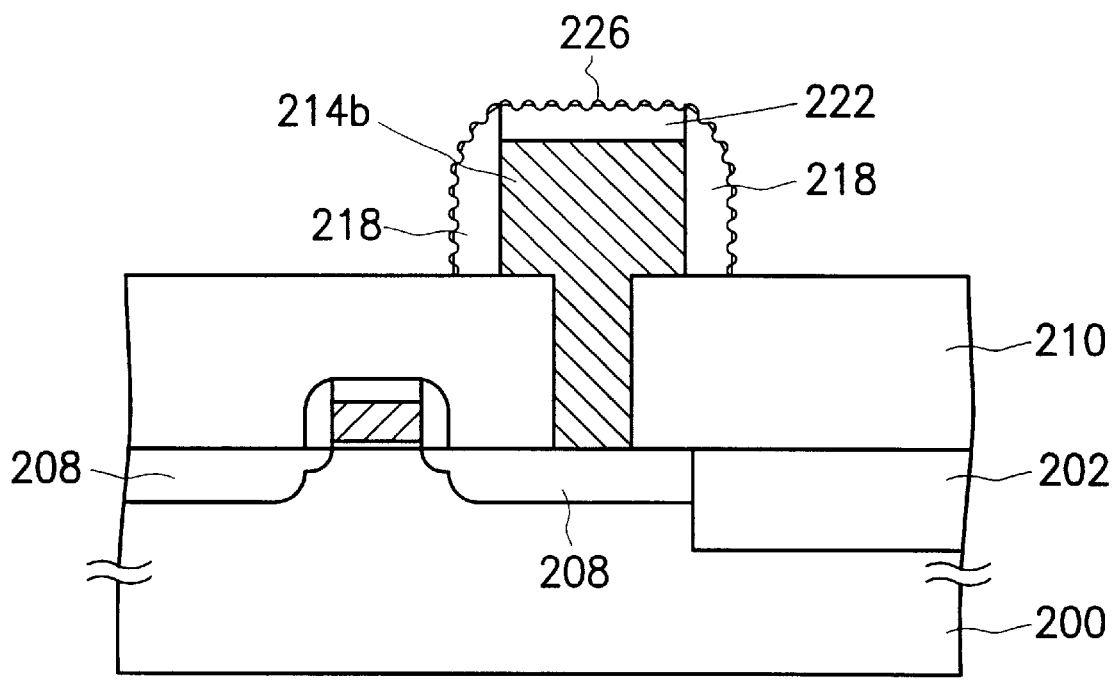

As shown in FIG. 2E, a hemispherical silicon grain layer 226 is formed on the exposed surfaces of the amorphous silicon spacers 218 and on the upper surface of the amorphous silicon layer 222. Hence, surface area of the lower electrode is increased. The exposed amorphous silicon surfaces are preferably first processed with hydrofluoric acid solution to remove any native oxide. Then, hemispherical silicon grains are grown on the amorphous silicon surfaces to form the hemispherical silicon grain layer 226 at a temperature of between 545° C. and 565° C.

In summary, major aspects of this invention includes:

1. A thinner layer of amorphous silicon is deposited for growing hemispherical silicon grains. Since there is no need to deposit a thick layer of amorphous silicon just to build the body of an electrode, both processing time and production cost can be saved.

2. Amorphous spacers are formed on the sidewalls of the doped polysilicon layer prior to transforming the upper layer of the doped polysilicon layer into an amorphous silicon layer by ion bombardment. Since the amorphous silicon spacers are very thin, the required depositing time is relatively short. With a shorter depositing time than the conventional method, fewer microcrystals are formed inside the amorphous silicon layer. Consequently, growth of hemispherical silicon grains on the amorphous silicon surfaces is unhampered.

3. The conventional method uses doped amorphous silicon to fill the contact opening that leads to a source/drain region. Since the level of dopants inside the amorphous silicon must be low to avoid microcrystals formation inside, contact resistance between the electrode and the source/drain terminal is usually high. In this invention, however, heavily doped polysilicon is used to fill the contact opening. Hence, a low contact resistance between the electrode and the source/drain terminal is obtained.

4. Processing operations that need to be carried out in this invention are compatible with current semiconductor processing operations, and therefore they can be readily incorporated into a production line to manufacture semiconductor devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming hemispherical silicon grains on a silicon layer, comprising the steps of:

providing a substrate, which has a dielectric layer on top, and has an opening in the dielectric layer to expose the substrate beneath the dielectric layer;

forming a doped polysilicon layer over the substrate, wherein the doped polysilicon layer also fills the opening;

patterning the doped polysilicon layer to remove an undesired portion;

forming amorphous silicon spacers on sidewalls of the doped polysilicon layer;

transforming an upper portion of the doped polysilicon layer into an amorphous silicon layer, wherein the amorphous silicon layer and the amorphous silicon spacer together cover the doped polysilicon layer; and forming hemispherical silicon grains on an exposed surface of the amorphous silicon spacers and an upper surface of the amorphous silicon layer lying above the doped polysilicon layer.

2. The method of claim 1, wherein the step of transforming the upper portion of the doped polysilicon layer into the amorphous silicon layer includes performing an ion implantation.

3. The method of claim 2, wherein the step of implanting ions includes implanting arsenic ions.

4. The method of claim 2, wherein the step of implanting ions includes implanting argon ions.

5. The method of claim 2, wherein the step of implanting ions includes implanting antimony ions.

6. The method of claim 2, wherein the step of implanting ions into the polysilicon layer to transform the upper portion of the doped polysilicon layer into an amorphous silicon layer includes implanting ions with such an energy level that a layer having a thickness of between 500 Å and 1500 Å from the upper surface of the doped polysilicon layer is completely transformed into an amorphous silicon layer.

7. A method for forming a lower electrode of a capacitor, comprising the steps of:

providing a substrate;

forming a dielectric layer over the substrate, wherein a contact opening that exposes a portion of the substrate is also formed in the dielectric layer;

forming a doped polysilicon layer that fills the contact opening and covers a portion of the dielectric layer;

patterning the doped polysilicon by photolithography;

forming amorphous silicon spacers on sidewalls of the doped polysilicon layer;

performing an ion implantation to transform an upper portion of the doped polysilicon layer into an amorphous silicon layer; and forming hemispherical silicon grains on an exposed surface of the amorphous silicon spacers and an upper surface of the amorphous silicon layer lying above the doped polysilicon layer.

8. The method of claim 7, wherein the step of performing the ion implantation to transform the upper portion of the doped polysilicon layer into the amorphous silicon layer includes implanting ions into the upper portion of the doped polysilicon layer.

9. The method of claim 8, wherein the step of implanting ions includes implanting arsenic ions.

10. The method of claim 8, wherein the step of implanting ions includes implanting argon ions.

11. The method of claim 8, wherein the step of implanting ions includes implanting antimony ions.

12. The method of claim 7, wherein the step of implanting ions into the polysilicon layer to transform the upper portion of the doped polysilicon layer into an amorphous silicon layer includes implanting ions with such an energy level that a layer having a thickness of between 500 Å and 1500 Å from the upper surface of the doped polysilicon layer is completely transformed into an amorphous silicon layer.

13. The method of claim 7, wherein the doped polysilicon layer can have a cylindrical profile.

* * * * *